(12) United States Patent
Park et al.

(10) Patent No.: US 7,927,166 B2
(45) Date of Patent: Apr. 19, 2011

(54) ORGANIC LIGHT EMITTING DISPLAY AND METHOD OF MANUFACTURING THE SAME

(75) Inventors: Chang-Mo Park, Hwaseong-si (KR);
Jae-Kook Ha, Yongin-si (KR);
Joo-Hyeon Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 52 days.

(21) Appl. No.: 12/357,350

(22) Filed: Jan. 21, 2009

(65) Prior Publication Data
US 2009/0261709 A1    Oct. 22, 2009

(30) Foreign Application Priority Data

Apr. 18, 2008 (KR) .......................... 10-2008-0036197

(51) Int. Cl.
*H01J 9/00*     (2006.01)
(52) U.S. Cl. ........................................................ 445/23

(58) Field of Classification Search .............. 445/23–25; 313/504, 506
See application file for complete search history.

(56) References Cited

U.S. PATENT DOCUMENTS 7,012,364 B2 *   3/2006   Mori et al. .................... 313/504

\* cited by examiner

*Primary Examiner* — Joseph L Williams
(74) *Attorney, Agent, or Firm* — Innovation Counsel LLP

(57) ABSTRACT

In a method of manufacturing an organic light emitting display according to an embodiment, when a thin film transistor substrate including a display area and a non-display area is prepared, an organic light emitting layer is formed on the display area. Then, a first cathode layer is formed on the organic light emitting layer through a first deposition method, and a second cathode layer is formed on the first cathode layer through a second deposition method. The first and/or second deposition method may be performed by using heat. Thus, the light-emitting quality of the organic light emitting display may be improved.

13 Claims, 7 Drawing Sheets

ORGANIC LIGHT EMITTING DISPLAY AND METHOD OF MANUFACTURING THE SAME

CROSS-REFERENCE TO RELATED APPLICATION

This application relies for priority upon Korean Patent Application No. 2008-36197 filed on Apr. 18, 2008, the contents of which are herein incorporated by reference in their entirety.

BACKGROUND

1. Technical Field

Embodiments of the present invention relate to an organic light emitting display and a method of manufacturing the same. More particularly, embodiments of the present invention relate to an organic light emitting display having an improved light-emitting quality and a method of manufacturing the organic light emitting display.

2. Description of the Related Art

In general, when applying an electric field to an organic material that serves as a light emitting layer, electrons and holes in the organic material are bonded to one another to generate a light. An organic light emitting display displays an image using the light generated from the organic material. The organic light emitting display includes an anode electrode that serves as a hole injection electrode, a cathode electrode that serves as an electron injection electrode, and an organic light emitting layer interposed between the anode electrode and the cathode electrode. In addition, the organic light emitting display further includes a thin film transistor that drives the organic light emitting display.

The organic light emitting display has a structure such that the organic light emitting layer and the cathode electrode are formed on a substrate on which the thin film transistor and the anode electrode are formed. The cathode electrode, generally, is formed by a sputtering method so that the organic light emitting layer is damaged and the light-emitting quality of the organic light emitting display is deteriorated.

SUMMARY

An exemplary embodiment of the present invention provides a method of manufacturing an organic light emitting display, capable of forming a cathode electrode without damaging an organic light emitting layer.

Another exemplary embodiment of the present invention also provides an organic light emitting display manufactured by the above method.

In an exemplary embodiment of the present invention, a method of manufacturing an organic light emitting display is provided as follows. When a thin film transistor substrate including a display area and a non-display area is prepared, an organic light emitting layer is formed on the display area. Then, a first cathode layer is formed on the organic light emitting layer through a first deposition method, and a second cathode layer is formed on the first cathode layer through a second deposition method. In this exemplary embodiment, at least one of the first deposition method or the second deposition method may be performed by using heat.

The first deposition method may be a heat vaporizing method and the second deposition method may be a sputtering method. The second cathode layer covers a portion of the non-display area, and the first cathode layer covers an upper surface and a side surface of the organic light emitting layer.

The first cathode layer is formed by fixing a mask that is used in forming the organic light emitting layer and is spaced apart from the thin film transistor substrate, and depositing a conductive material on the organic light emitting layer.

The second cathode layer may be of a same material as the first cathode layer, or the second cathode layer may be of a different material than the first cathode layer. The conductive material may include aluminum (Al), silver (Ag), gold (Au), copper (Cu), or an alloy thereof. End portions of the first cathode layer have a width of about 0.5 mm to about 5 mm from the end portions of the organic light emitting layer, respectively, and end portions of the second cathode layer have a width of about 1 mm to about 10 mm from the end portions of the first cathode layer, respectively.

In another exemplary embodiment of the present invention, an organic light emitting display includes a thin film transistor substrate including a display area and a non-display area, an organic light emitting layer formed on the display area, a first cathode layer including a first conductive material and covering an upper surface of the organic light emitting layer, and a second cathode layer including a second conductive material and covering an upper surface of the first cathode layer and a portion of the non-display area. In this exemplary embodiment, the first and second conductive materials may include a metal that reflects light.

The first and second conductive materials may be different metal materials that reflect light, or the first and second conductive materials may be a same metal material that reflects light.

The first and second conductive materials may include aluminum (Al), silver (Ag), gold (Au), copper (Cu), or an alloy thereof, and the first and second cathode layers may have different densities from each other.

According to one or more embodiments of the manufacturing method of the organic light emitting display, the cathode electrodes may be formed without damaging the organic light emitting layer. In addition, voids may be prevented from occurring in the cathode electrodes, and the deposition speed of the conductive materials may be increased. Consequently, the organic light emitting layer is protected by the two cathode electrodes, thereby improving the light-emitting quality.

BRIEF DESCRIPTION OF THE DRAWINGS

The above and other advantages of the embodiments of the present invention will become readily apparent by reference to the following detailed description when considered in conjunction with the accompanying drawings wherein.

DETAILED DESCRIPTION

Figure 1A:
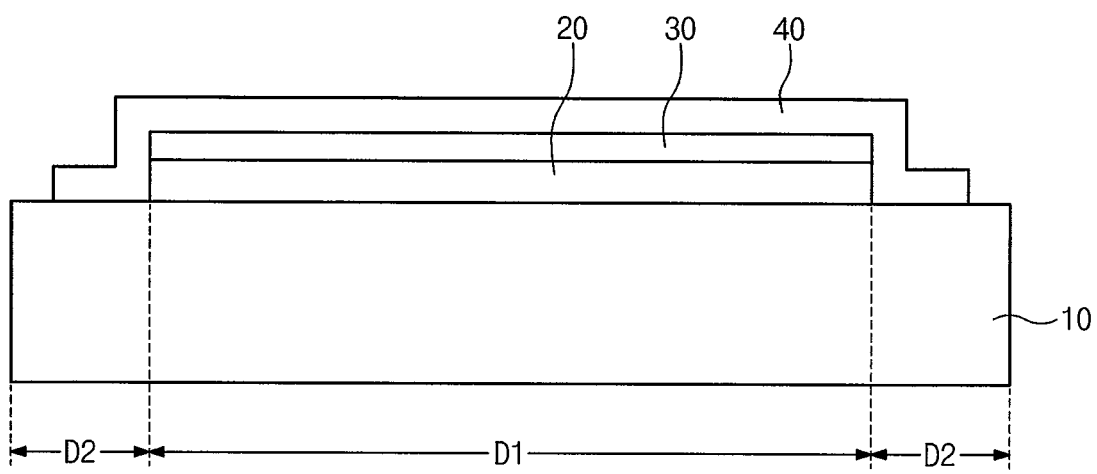
FIGS. 1A and 1B are views showing an organic light emitting display according to an exemplary embodiment of the present invention.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be explained in detail with reference to the accompanying drawings.

Figure 1B:
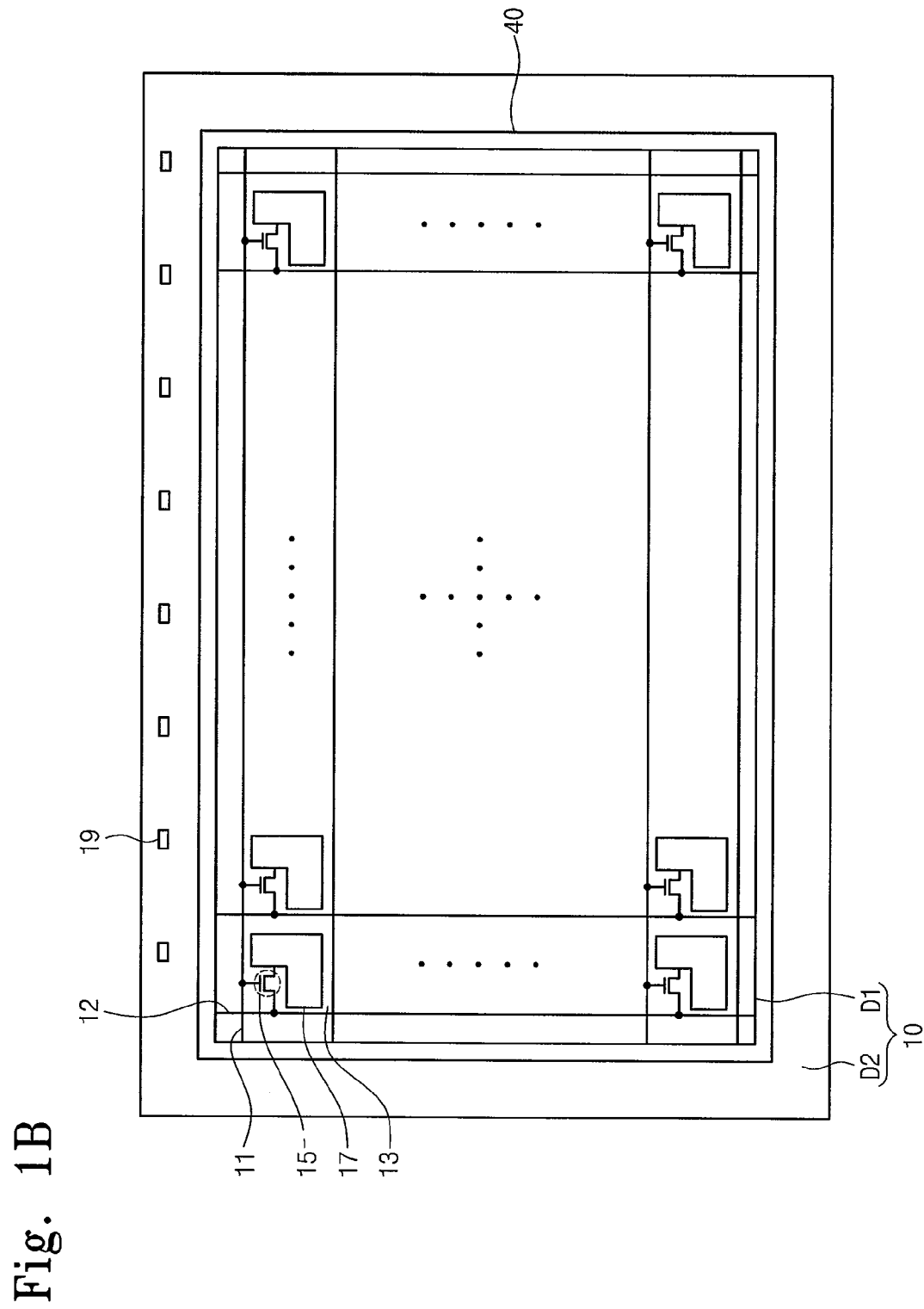

FIGS. 1A and 1B are views showing an organic light emitting display according to an exemplary embodiment of the present invention.

Referring to FIGS. 1A and 1B, an organic light emitting display includes a thin film transistor substrate 10, an organic light emitting layer 20, a first cathode layer 30, and a second cathode layer 40.

The thin film transistor substrate 10 is divided into two areas, i.e., a display area D1 and a non-display area D2.

The display area D1 is an area in which an image is displayed. The display area D1 includes a gate line 11 extending in a direction, a data line 12 crossing the gate line 11, a pixel area 13 defined by the gate line 11 and the data line 12, a thin film transistor 15 connected to the gate line 11 and the data line 12, and an anode electrode 17 arranged in the pixel area 13 and connected to the thin film transistor 15. The thin film transistor 15 includes a gate electrode, an insulating layer, a semiconductor layer, a source electrode and a drain electrode. Plural pixel areas are arranged in the form of a matrix to define the display area D1.

The non-display area D2 is an area in which an image is not displayed. The non-display area D2 includes a contact part 19 that is connected to a driver (not shown) to apply a driving signal to the thin film transistor 15.

The organic light emitting layer 20 is formed on the display area D1. Particularly, the organic light emitting layer 20 includes a plurality of layers such as a hole injection layer, a hole transfer layer, an emission material layer and an electron injection layer, which are sequentially stacked on the thin film transistor substrate 10. The organic light emitting layer 20 may display various colors according to the emission material layer.

The first cathode layer 30 covers the organic light emitting layer 20. The first cathode layer 30 includes a conductive material such as aluminum (Al), silver (Ag), gold (Au), copper (Cu) or an alloy thereof, and may have a thickness of about 100 angstroms to about 1000 angstroms.

The second cathode layer 40 covers an upper surface of the first cathode layer 30 and a portion of the non-display area D2. The second cathode layer 40 includes a conductive material that may reflect light, for example, aluminum (Al), silver (Ag), gold (Au), copper (Cu) or an alloy thereof. The second cathode layer 40 may have a thickness of about 1001 angstroms to about 5000 angstroms.

The first cathode layer 30 and the second cathode layer 40 may include different materials or the same material.

In one or more embodiments wherein the first and second cathode layers 30 and 40 include the same material, the first and second cathode layers 30 and 40 may have different densities. In other words, since the first cathode 30 is formed by depositing a material such as aluminum (Al) through a thermal evaporation method, the first cathode 30 may be provided with voids therein. The second cathode layer 40 is formed by depositing a material such as aluminum (Al) through a sputtering method such that the second cathode layer 40 does not include voids. Accordingly, the first cathode layer 30 has a lower density than that of the second cathode layer 40 because of the voids.

Figure 2:
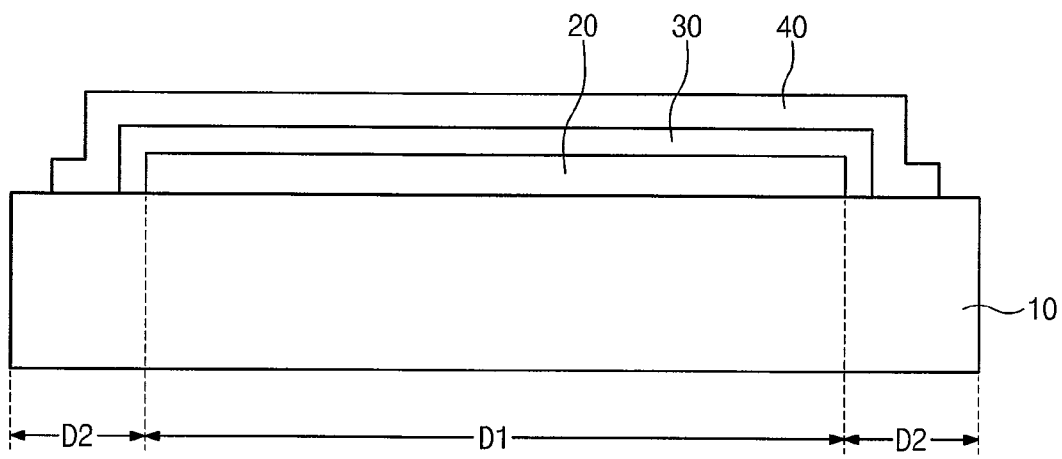
FIG. 2 is a sectional view showing an organic light emitting display according to another exemplary embodiment of the present invention.
Figure 3:
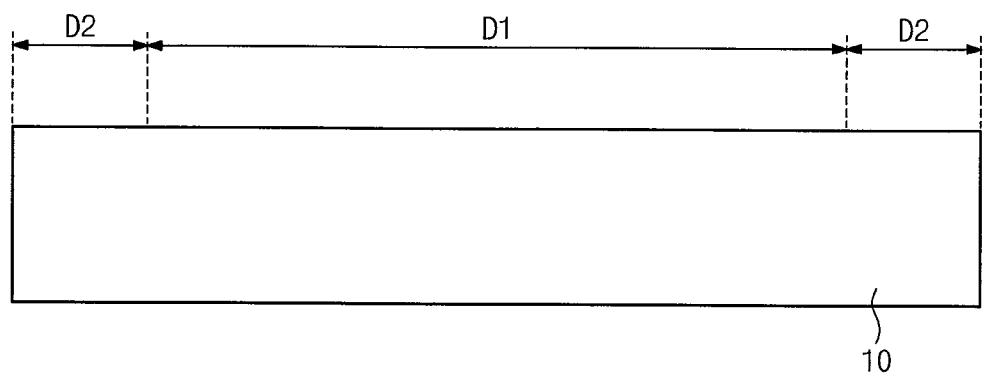
FIGS. 3, 4A, 4B, 5A, 5B, 5C, 5D 6A and 6B are sectional views illustrating a method of manufacturing an organic light emitting display according to an exemplary embodiment of the present invention.

FIG. 2 is a sectional view showing an organic light emitting display according to another exemplary embodiment of the present invention. In FIG. 2, the same reference numerals denote the same elements in FIGS. 1A and 1B, and thus detailed description of the same elements will be omitted.

Referring to FIG. 2, the organic light emitting display includes a thin film transistor substrate 10 that is divided into two areas, i.e., a display area D1 and a non-display area D2, a first cathode layer 30, and a second cathode layer 40.

The first cathode layer 30 covers an upper surface and a side surface of the organic light emitting layer 20. End portions of the first cathode layer 30, which cover the side surface of the organic light emitting layer 20, cover portions of the non-display area D2 adjacent to the organic light emitting layer 20. That is, the portions of the non-display area D2 covered by the end portions of the first cathode layer 30 have a width of about 0.5 mm to about 5 mm from the ends of the organic light emitting layer 20.

In addition, the second cathode layer 40 covers upper and side surfaces of the first cathode layer 30 and portions of the non-display area D2. The portions of the non-display area D2 covered by the end portions of the second cathode layer 40 have a width of about 1 mm to about 10 mm from the ends of the organic light emitting layer 20.

FIGS. 3, 4A, 4B, 5A, 5B, 5C, 5D, 6A and 6B are sectional views illustrating a method of manufacturing an organic light emitting display according to an exemplary embodiment of the present invention.

Referring to FIGS. 3, 4A, 4B, 5A, 5B, 5C, 5D, 6A and 6B, a thin film transistor substrate 10 that is divided into a display area D1 and a non-display area D2 is prepared. Particularly, a thin film transistor and an anode electrode are formed in each of the pixel areas that are arranged in the display area D1. The thin film transistor is formed on a substrate and includes a gate electrode, an insulating layer, a semiconductor layer, and source and drain electrodes, which are sequentially stacked one on another. The anode electrode is formed in each pixel area and is electrically connected to the thin film transistor. The anode electrode includes a transparent conductive material such that a light is emitted toward a rear side of the thin film transistor substrate 10.

Figure 4A:
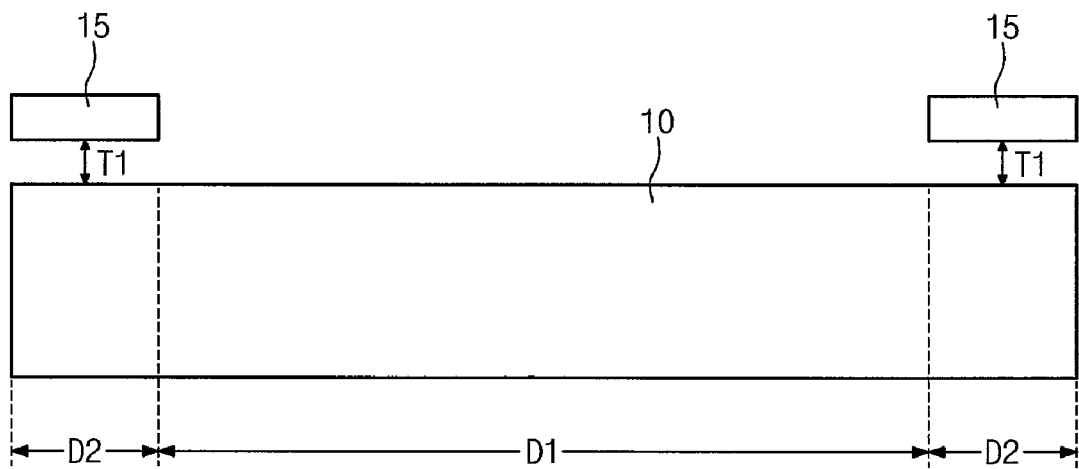

As shown in FIG. 4A, a mask 15, which leaves an area corresponding to the display area D1 opened, is disposed above the thin film transistor substrate 10. The mask 15 is spaced apart from the thin film transistor substrate 10 by a first distance T1.

Figure 4B:
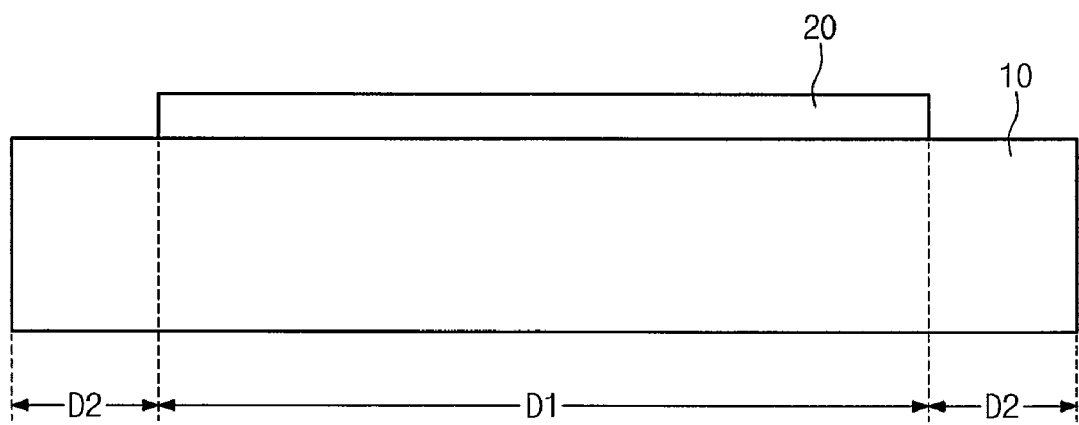

Referring to FIG. 4B, organic materials are sequentially deposited on the thin film transistor substrate 10 in order to form a hole injection layer, a hole transfer layer, an emission material layer, an electron transfer layer, and an electron injection layer. The organic materials are formed by using an organic material container installed with a deposition device and moving the organic material container above the mask 15. After one organic material is deposited, the deposition process is repeatedly performed, wherein the organic material container is replaced with another organic material container for the deposition of the next organic material. Accordingly, the organic materials passing through the mask 15 are sequentially deposited on the display area D1, so that the organic light emitting layer 20 including the hole injection layer, the hole transfer layer, the emission material layer, the electron transfer layer, and the electron injection layer may be formed.

Figure 5A:
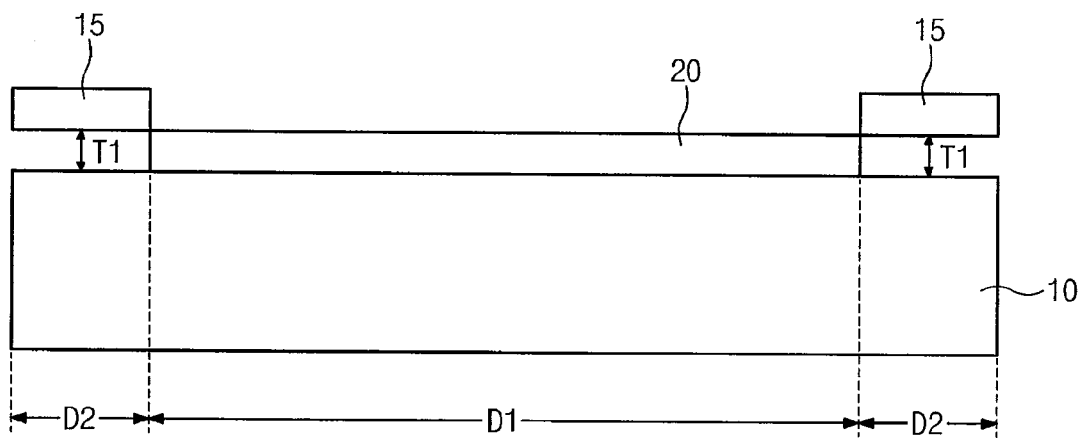
Figure 5B:
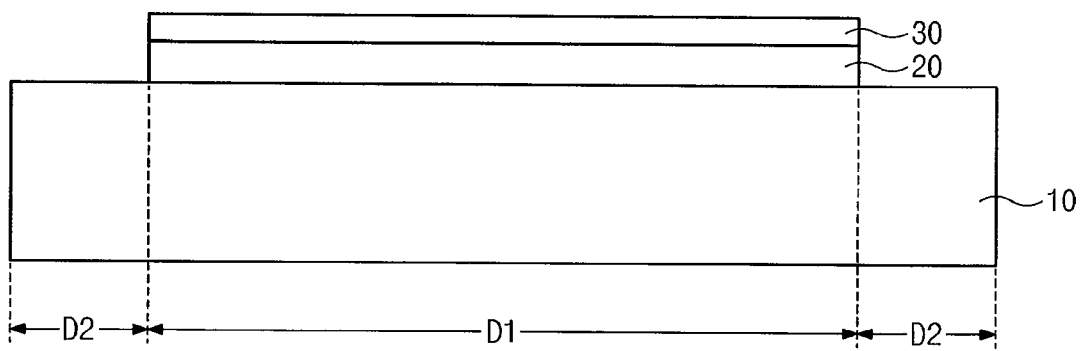

Referring to FIGS. 5A and 5B, a first conductive material that reflects light is formed on the organic light emitting layer 20 by using a heat vaporizing method. When forming the first conductive material, the mask 15 used in depositing the organic materials is used. That is, the thin film transistor substrate 10 is inserted into a chamber while the mask 15 used in depositing the organic materials is disposed above the thin film transistor substrate 10 as shown in FIG. 5A. Next, after setting the chamber in a high vacuum state, the first conductive material is heated to vaporize the first conductive material. As a result, the vaporized first conductive material is deposited on the organic light emitting layer 20, thereby forming the first cathode layer 30. The cathode layer 30 may have a thickness of about 100 angstroms to about 1000 angstroms.

The first conductive material 30 is deposited at a slow deposition speed to prevent occurrence of voids in the first cathode layer 30. The first conductive material may include a single metal, such as aluminum (Al), silver (Ag), gold (Au), copper (Cu) or an alloy thereof.

Figure 5C:
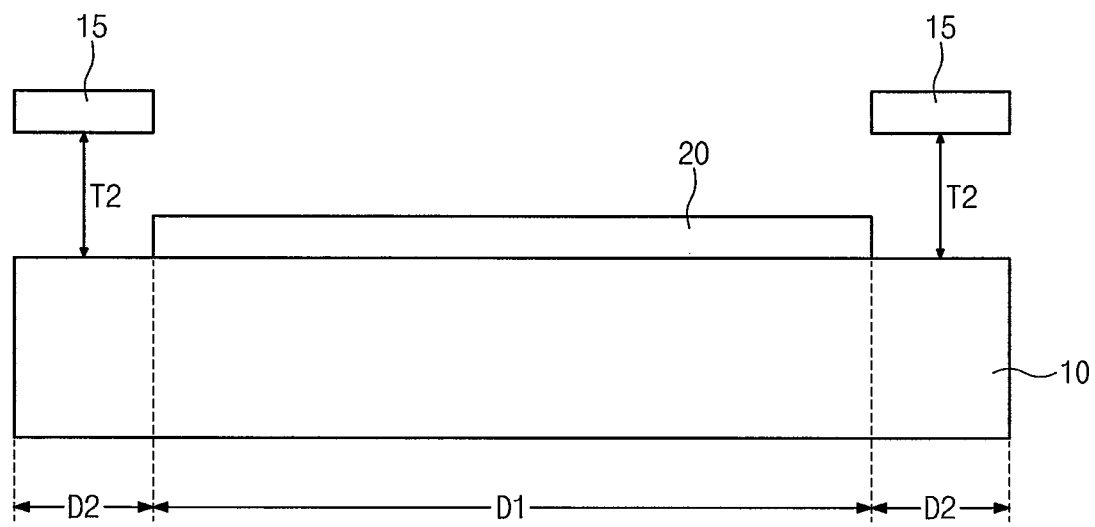
Figure 5D:
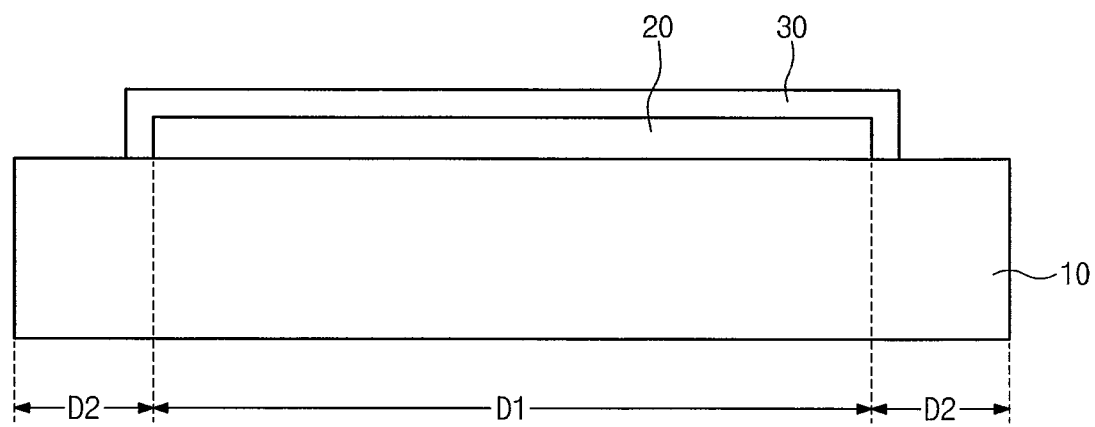

Meanwhile, as another example of the first cathode layer 30 as shown in FIGS. 5C and 5D, the first cathode layer 30 may be formed to cover an upper surface and a side surface of the organic light emitting layer 20. More particularly, the mask 15 used in depositing the organic materials is spaced apart from the thin film transistor substrate 10 by a second distance T2 and held thereat. Next, when the first conductive material is heated and vaporized, the vaporized first conductive material is deposited to cover the upper and side surfaces of the organic light emitting layer 20 after passing through the opened portion of the mask 15. Thus, the first cathode layer 30 may be formed to cover the upper and side surfaces of the organic light emitting layer 20. In this exemplary embodiment, end portions of the first cathode layer 30 have a width of about 0.5 mm to about 5 mm from the ends of the organic light emitting layer 20.

Figure 6A:
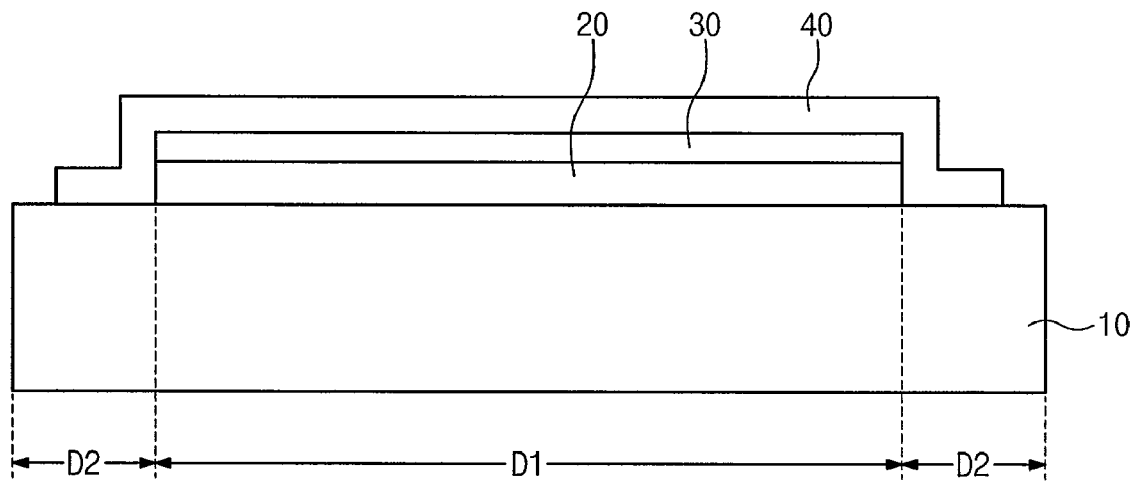

Referring to FIG. 6A, a second conductive material is deposited on the first cathode layer 30 and a portion of the non-display area D2 to form a second cathode layer 40. The second conductive material may be deposited by a sputtering method.

Particularly, the thin film transistor substrate 10 on which the first cathode layer 30 is formed and a target including the second conductive material are placed in a sputtering chamber. Then, a sputtering gas is injected into the sputtering chamber and a direct-current voltage is applied to the target, so that the plasma is generated in the sputtering chamber. When ionizing the sputtering gas by using the plasma and colliding with the target, the second conductive material is deposited on the first cathode layer 30 and the portion of the non-display area D2, thereby forming the second cathode layer 40. The second cathode layer 40 may have a thickness of about 1001 angstroms to about 5000 angstroms.

In the present exemplary embodiment, the second conductive material may be a single metal such as aluminum (Al), silver (Ag), gold (Au), copper (Cu), or an alloy thereof. Thus, the materials for the first and second cathode layers 30 and 40 may be the same as or different from each other.

Figure 6B:
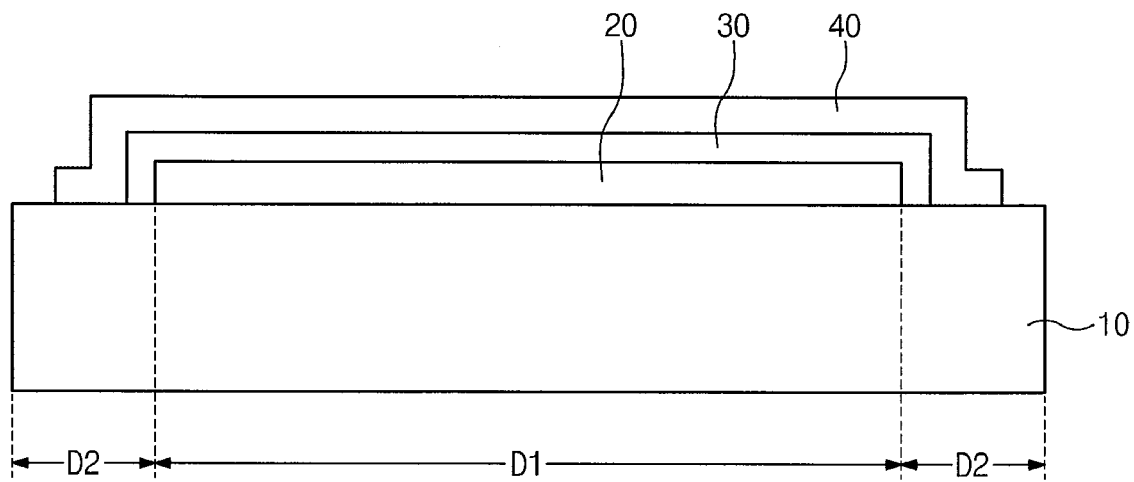

Meanwhile, referring to FIG. 6B, the second cathode layer 40 may be formed by depositing the second conductive material on the upper and side surfaces of the first cathode layer 30 and on the portion of the non-display area D2. In this case, end portions of the second cathode layer 40 may have a width of about 1 mm to about 10 mm from the ends of the first cathode layer 30.

Since the second cathode layer 40 is formed by the sputtering method, voids do not occur in the second cathode layer 40. Accordingly, the second cathode layer 40 may be formed by depositing the second conductive material at a relatively fast deposition speed. For instance, in order to form the first cathode layer 30 having a thickness of about 500 angstroms, the first conductive material is deposited using the heat vaporizing method for about 100 seconds at a speed of 5 Å/s. Also, in order to form the second cathode layer 40 having a thickness of about 2500 angstroms, the second conductive material is deposited using the sputtering method for about 100 seconds at a speed of 25 Å/s.

According to one or more embodiments of the manufacturing method of the organic light emitting display, the cathode electrodes may be formed without damaging the organic light emitting layer. In addition, voids may be prevented from occurring in the cathode electrodes and the deposition speed of the conductive materials may be increased. Consequently, the organic light emitting layer is protected by the two cathode electrodes, thereby improving the light-emitting quality.

Although the exemplary embodiments of the present invention have been described, it is understood that the present disclosure should not be limited to these exemplary embodiments but various changes and modifications can be made by one ordinary skilled in the art within the spirit and scope of the present disclosure as hereinafter claimed.

What is claimed is:

1. A method of manufacturing an organic light emitting display, the method comprising:

preparing a thin film transistor substrate including a display area and a non-display area;

forming an organic light emitting layer on the display area;

forming a first cathode layer on the organic light emitting layer through a first deposition method; and forming a second cathode layer directly on the first cathode layer through a second deposition method, wherein at least one of the first deposition method or the second deposition method is performed by a heat vaporizing method.

2. The method of claim 1, wherein the first deposition method is the heat vaporizing method and the second deposition method is a sputtering method.

3. The method of claim 1, wherein the second cathode layer covers a portion of the non-display area.

4. The method of claim 3, wherein the first cathode layer covers an upper surface and a side surface of the organic light emitting layer.

5. The method of claim 2, wherein the forming of the first cathode layer comprises:

fixing a mask that is used in forming the organic light emitting layer and is spaced apart from the thin film transistor substrate; and depositing a conductive material on the organic light emitting layer.

6. The method of claim 5, wherein the second cathode layer comprises a same material as the first cathode layer.

7. The method of claim 5, wherein the second cathode layer comprises a different material from the first cathode layer.

8. The method of claim 5, wherein the conductive material comprises aluminum (Al), silver (Ag), gold (Au), copper (Cu), or an alloy thereof.

9. The method of claim 4, wherein end portions of the first cathode layer have a width of about 0.5 mm to about 5 mm from end portions of the organic light emitting layer, respectively.

10. The method of claim 9, wherein end portions of the second cathode layer have a width of about 1 mm to about 10 mm from the end portions of the first cathode layer, respectively.

11. The method of claim 1, wherein the first cathode layer is thinner than the second cathode layer.

12. The method of claim 11, wherein the first cathode layer has a thickness of about 100 angstroms to about 1000 angstroms, and the second cathode layer has a thickness of about 1001 angstroms to about 5000 angstroms.

13. The method of claim 1, wherein the first deposition method is the heat vaporizing method and the second deposition method is a method other than the heat vaporizing method.

* * * * *